(12) United States Patent
Fukuda

(10) Patent No.: US 12,525,498 B2
(45) Date of Patent: Jan. 13, 2026

(54) SEMICONDUCTOR DEVICE

(71) Applicant: FUJI ELECTRIC CO., LTD., Kawasaki (JP)

(72) Inventor: Taisuke Fukuda, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 407 days.

(21) Appl. No.: 18/172,648

(22) Filed: Feb. 22, 2023

(65) Prior Publication Data

US 2023/0335450 A1    Oct. 19, 2023

(30) Foreign Application Priority Data

Apr. 13, 2022 (JP) ................... 2022-066156

(51) Int. Cl.
*H01L 23/31* (2006.01)
*H01L 23/00* (2006.01)
(Continued)

(52) U.S. Cl.
CPC ........ *H01L 23/3107* (2013.01); *H01L 23/295* (2013.01); *H01L 23/49811* (2013.01); *H01L 24/32* (2013.01); *H01L 24/33* (2013.01); *H01L 24/48* (2013.01); *H01L 2224/32225* (2013.01); *H01L 2224/32245* (2013.01); *H01L 2224/3303* (2013.01); *H01L 2224/48175* (2013.01); *H01L 2924/186* (2013.01)

(58) Field of Classification Search
CPC ............... H01L 23/3107; H01L 23/295; H01L 23/49811; H01L 24/32; H01L 24/33; H01L 24/48; H01L 2224/32225; H01L 2224/32245; H01L 2224/3303; H01L 2224/48175; H01L 2924/186; H01L 25/072; H01L 23/3142; H01L 23/562; H01L 24/34; H01L 24/49; H01L 24/45; H01L 23/053; H01L 23/24; H01L 24/29; H01L 23/043; H01L 23/06; H01L 23/10; H01L 23/18

See application file for complete search history.

(56) References Cited

U.S. PATENT DOCUMENTS

| 4,614,387 A * | 9/1986 | Hartl ................. H05K 7/1076 439/70 |
| 2008/0000302 A1* | 1/2008 | Ueno ................. G01L 19/0038 73/717 |

(Continued)

FOREIGN PATENT DOCUMENTS

| JP | 08064759 A | 3/1996 |
| JP | 2015162649 A | 9/2015 |

(Continued)

*Primary Examiner* — Tucker J Wright

(57) ABSTRACT

A semiconductor device includes: a baseplate; an insulating substrate on the baseplate; a semiconductor element on the insulating substrate; a case bonded to the baseplate by an adhesive, the case surrounding a space in which the semiconductor element is positioned; and an encapsulating material filling the space surrounded by the case, in which, the case includes a claw, the claw includes: a protrusion protruding from an inner wall surface of the case; and a hook inclined from the protrusion, a space being sandwiched between the hook and the inner wall surface of the case.

18 Claims, 11 Drawing Sheets

(51) Int. Cl.
*H01L 23/29* (2006.01)
*H01L 23/498* (2006.01)

(56) References Cited

U.S. PATENT DOCUMENTS

2019/0191565 A1* 6/2019 Oka .................. H01L 23/49822
2020/0286840 A1   9/2020 Kaji et al.
2021/0305107 A1* 9/2021 Miyata ................ H01L 23/3121

FOREIGN PATENT DOCUMENTS

JP   2021158197 A   10/2021
WO   2019008828 A1   1/2019

* cited by examiner

SEMICONDUCTOR DEVICE

CROSS REFERENCE TO RELATED APPLICATION

This application is based on, and claims priority from, Japanese Patent Application No. 2022-66156, filed Apr. 13, 2022, the entire contents of which are incorporated herein by reference.

BACKGROUND

Technical Field

This disclosure relates to a semiconductor device used in a power electronics device such as an inverter.

Related Art

As a semiconductor device used in a power electronic device, a semiconductor device is known that includes a baseplate coupled to a cooler, an insulating substrate on the baseplate, a semiconductor element on the insulating substrate, a case surrounding a space in which the semiconductor element is positioned, and an encapsulating material with which the space surrounded by the case is filled (see, for example, Japanese Patent Application Laid-Open Publication No. 2015-162649 and WO 2019/008828). In such a semiconductor device, the case is sometimes bonded to the baseplate by an adhesive (see, for example, Japanese Patent Application Laid-Open Publication No. H 8-64759).

In the conventional semiconductor device described above, the adhesive on the baseplate needs to protrude from the case to enhance a bond between the baseplate and the case.

However, when the adhesive protrudes from the case, an interface between the protruding adhesive and the encapsulating material arises.

Accordingly, detachment of the encapsulating material from the case starts easily. In addition, a point arises at which the adhesive, the baseplate, and the encapsulating material are in contact with each other. Accordingly, the point tends to become a starting point of the detachment.

SUMMARY OF THE INVENTION

In view of the problems described above, an object of one aspect according to the present disclosure is to provide a technique capable of substantially preventing an expansion of detachment of an encapsulating material from a starting point, at which an adhesive, a baseplate, and the encapsulating material are in contact with each other, in a semiconductor device in which a case is bonded to the baseplate by the adhesive.

In one aspect, a semiconductor device includes: a baseplate; an 25 insulating substrate on the baseplate; a semiconductor element on the insulating substrate; a case bonded to the baseplate by an adhesive, the case surrounding a space in which the semiconductor element is positioned; and an encapsulating material filling the space surrounded by the case, in which, the case includes a claw, the claw includes: a protrusion protruding from an inner wall surface of the case; and a hook inclined from the protrusion, a space being sandwiched between the hook and the inner wall surface of the case.

According to this disclosure, the claw includes the protrusion that protrudes from the inner wall surface of the case. Accordingly, it is possible to substantially prevent movement of the encapsulating material in a vertical direction. In addition, the claw includes a hook, and a space is sandwiched between the hook and the inner wall surface of the case. Accordingly, it is possible to substantially prevent movement of the encapsulating material in the space in a horizontal direction. Therefore, it is possible for the claw to substantially prevent detachment of the encapsulating material from the case due to the adhesive, from expanding from a baseplate.

DESCRIPTION OF EMBODIMENTS

Embodiments according to the present disclosure will be described with reference to the drawings. The following embodiments are examples of the present disclosure, and they may be changed as appropriate, and they are not limited thereto.

First Embodiment

Figure 1:
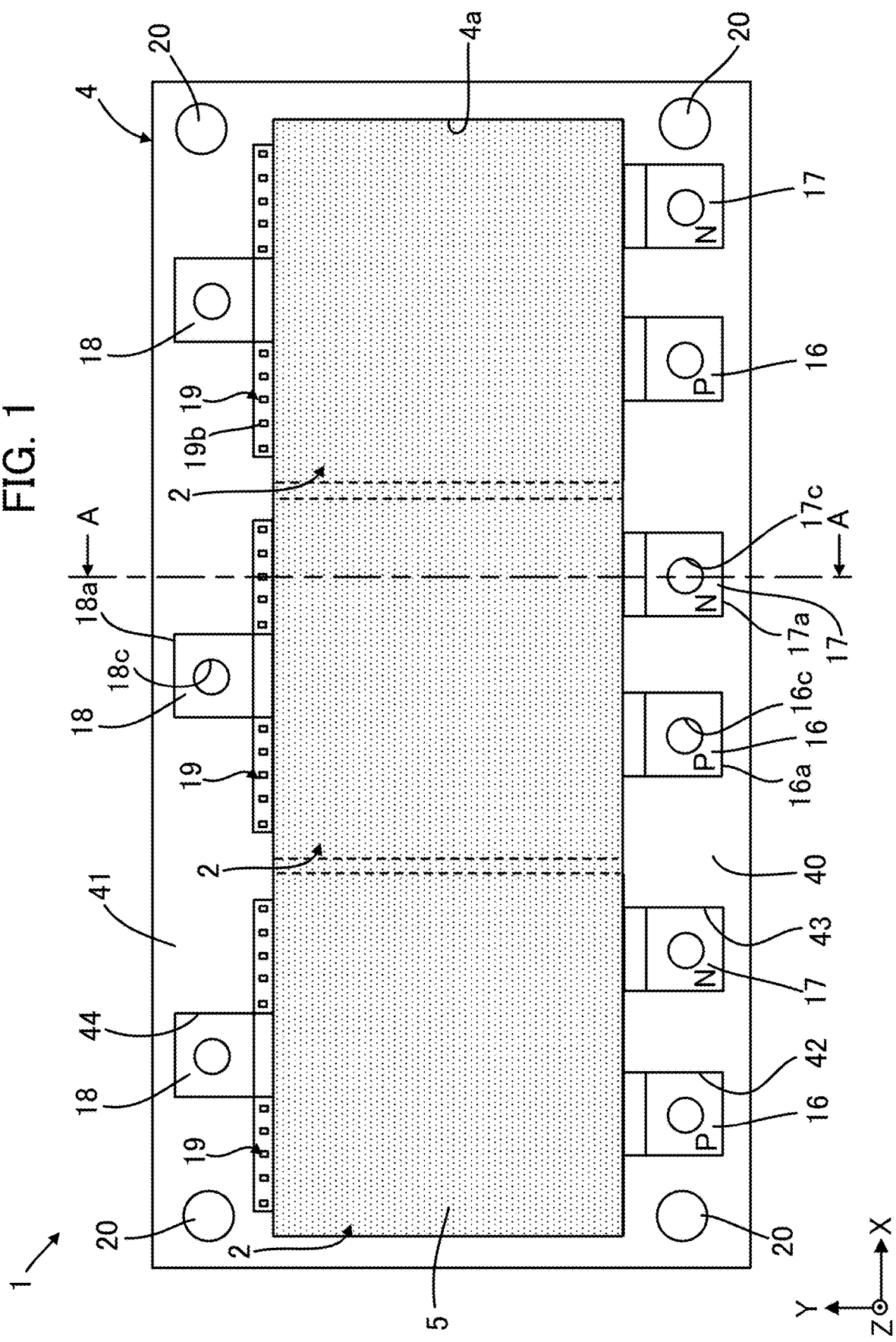
FIG. 1 is a plan view showing a semiconductor device 1 according to a first embodiment.
Figure 2:
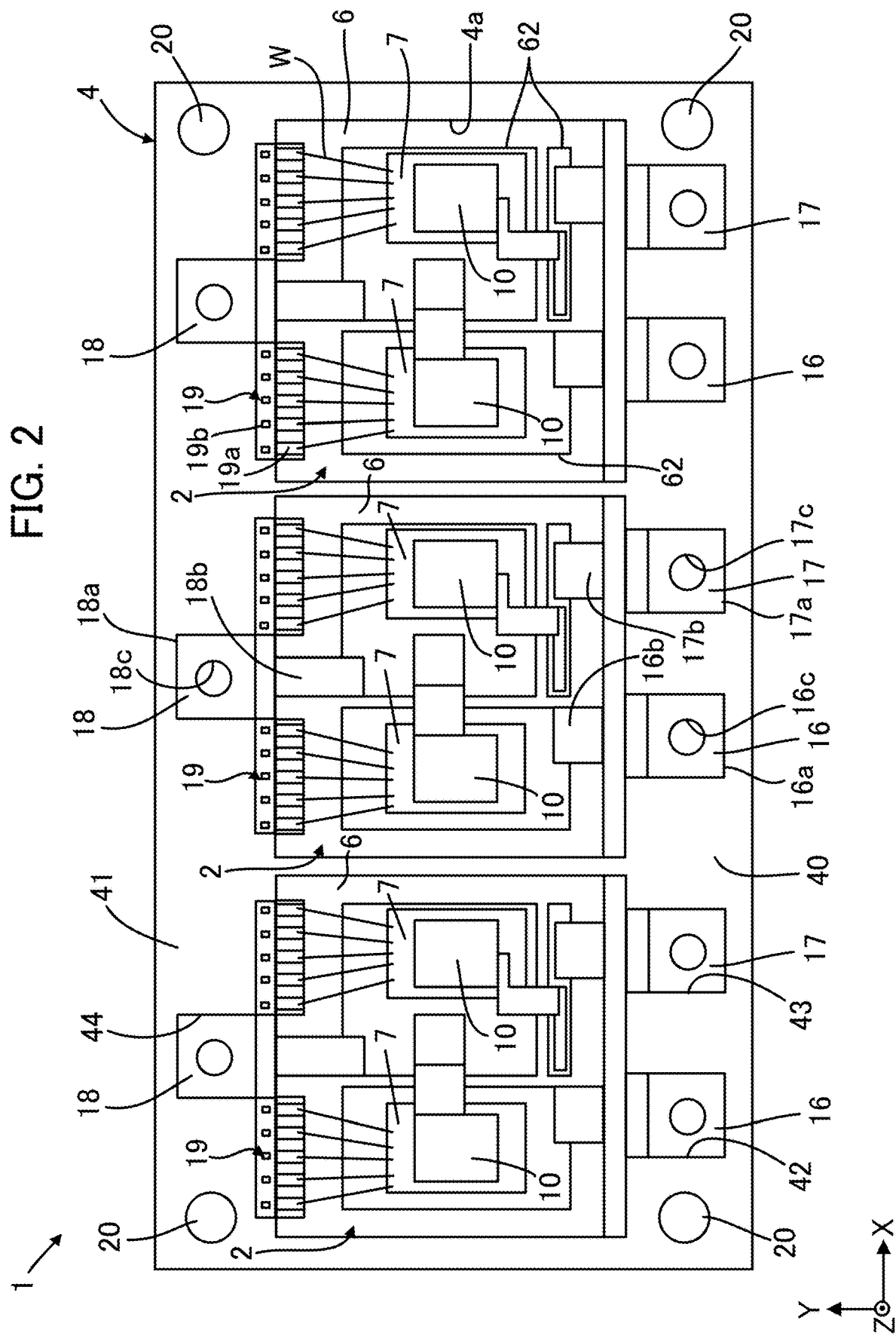
FIG. 2 is a plan view showing the semiconductor device 1 without an encapsulating material 5.
Figure 3:
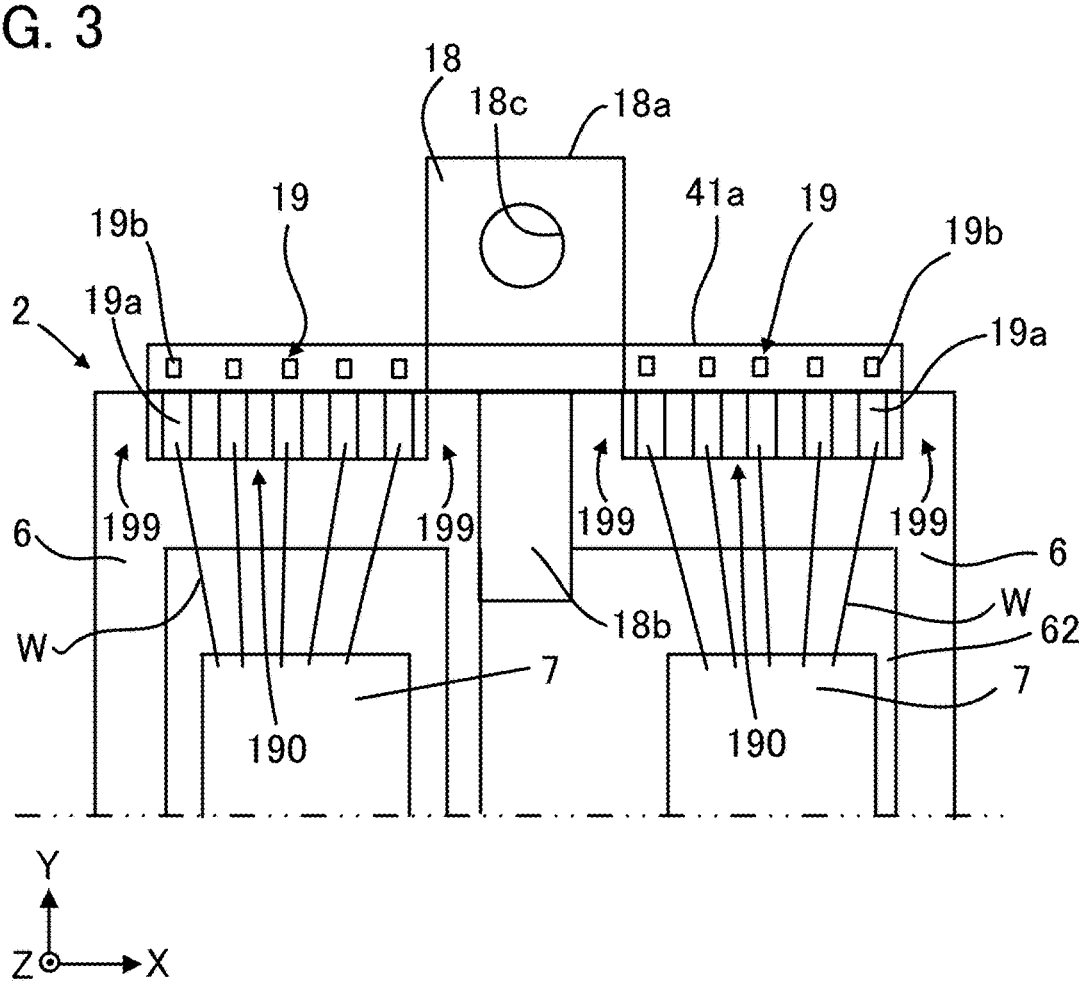
FIG. 3 is a plan view showing an enlarged portion of the semiconductor device 1 shown in FIG. 2.
Figure 4:
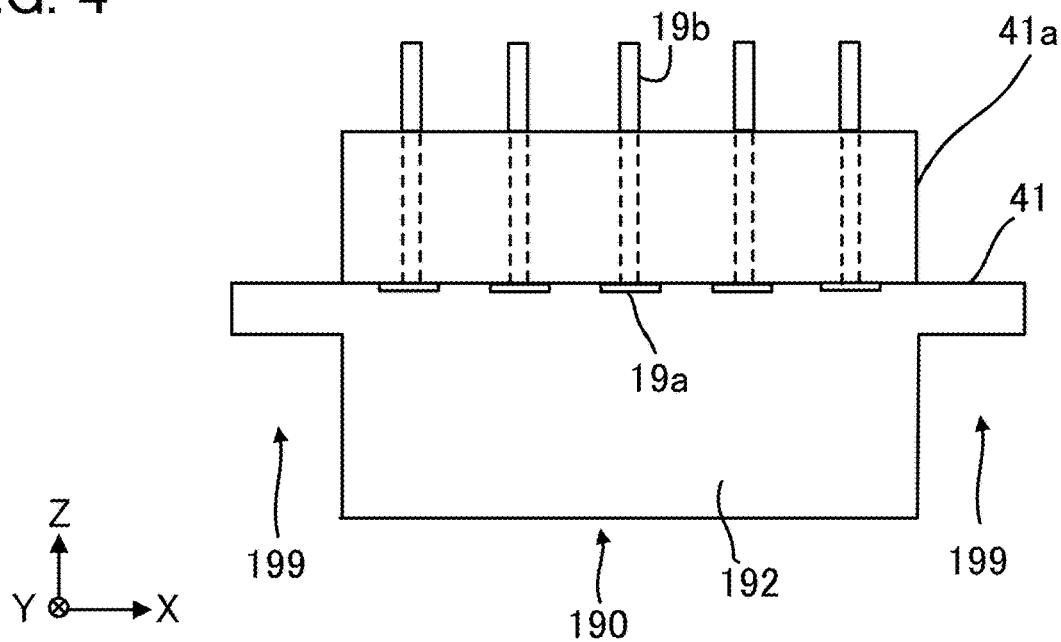
FIG. 4 is a front view showing a claw 190 shown in FIG. 3 viewed in a Y direction.
Figure 5:
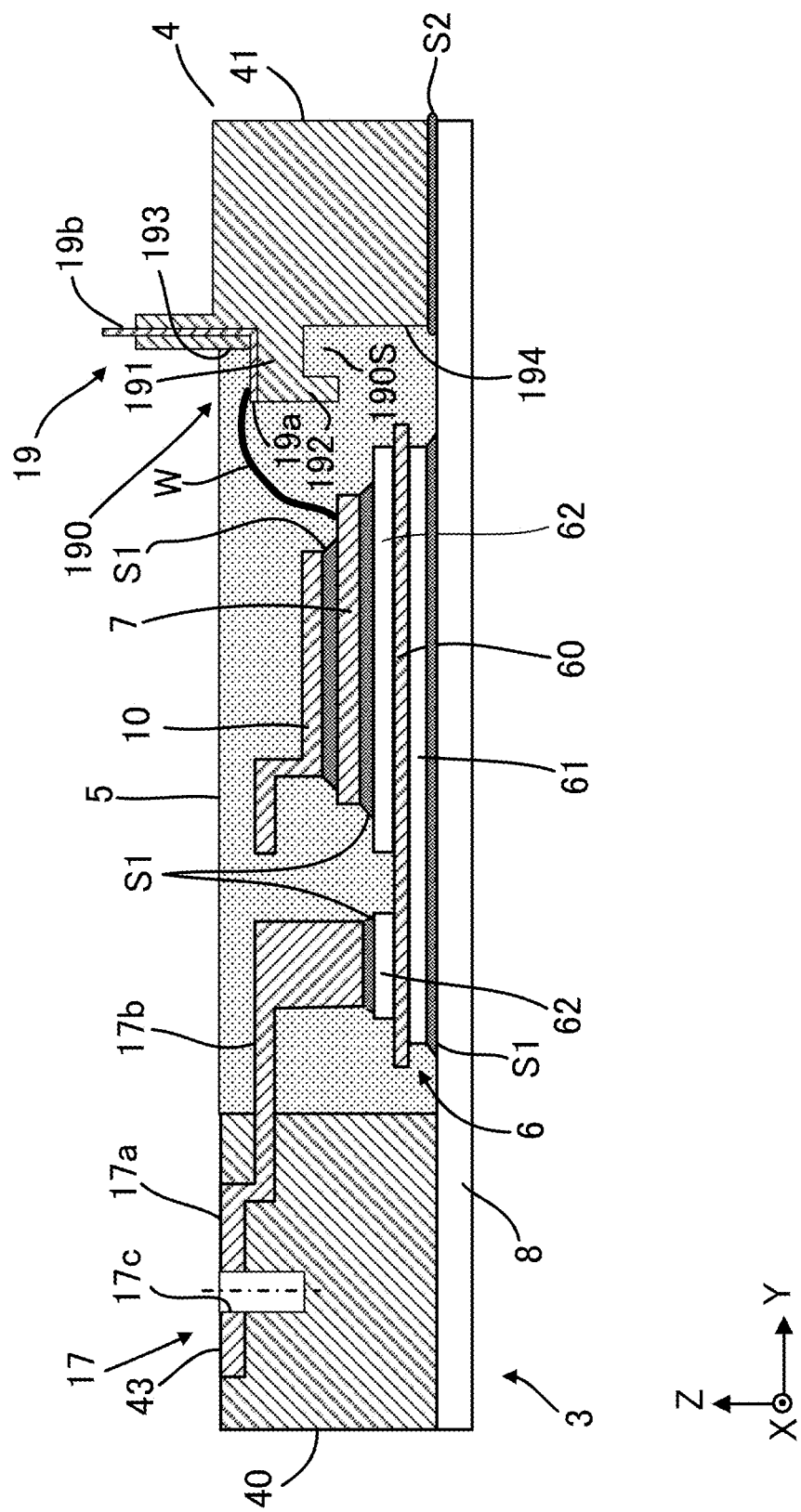
FIG. 5 is a cross section showing the semiconductor device 1 taken along line A-A shown in FIG. 1.
Figure 6:
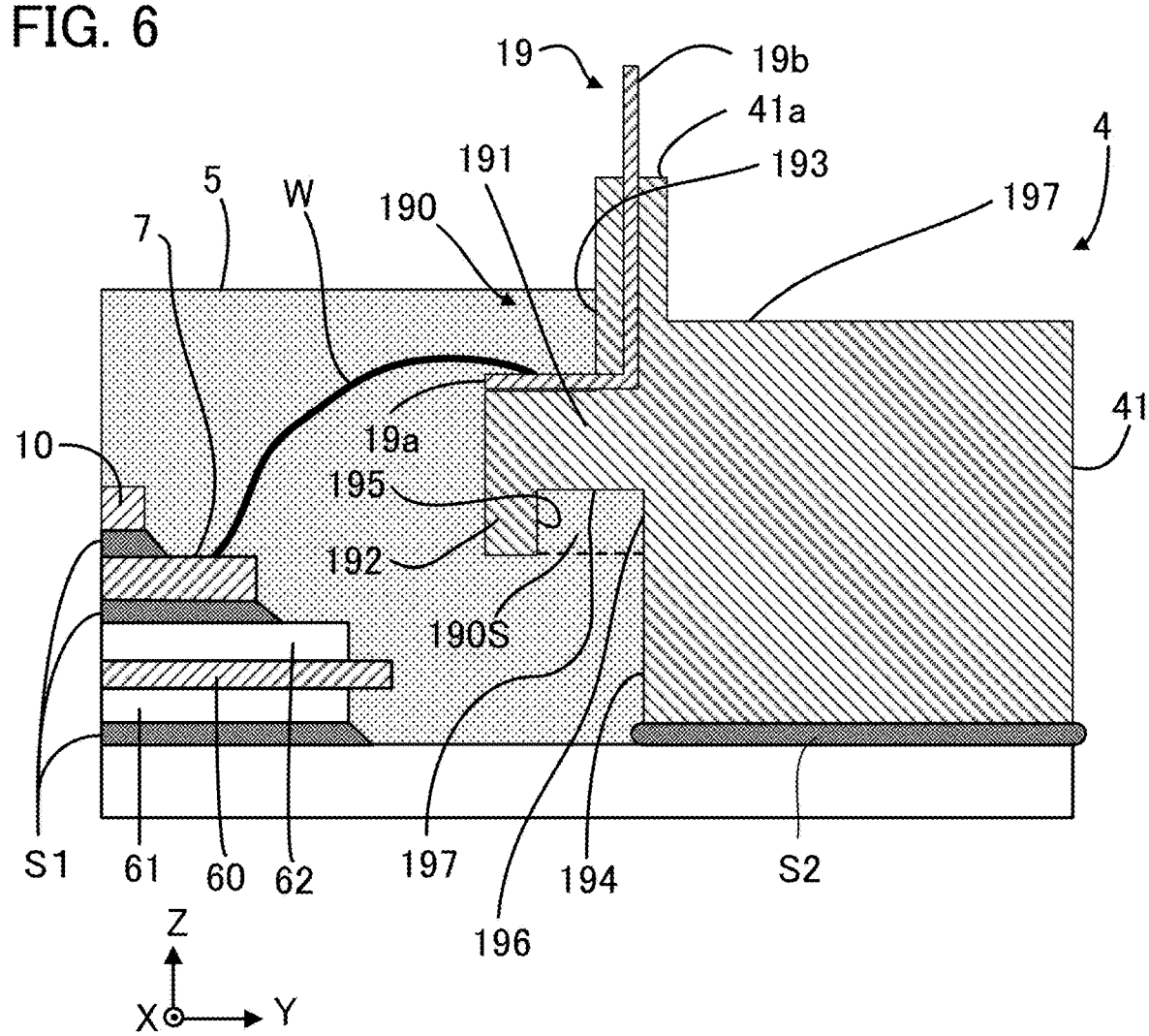
FIG. 6 is a cross section showing the enlarged claw 190 shown in FIG. 5.

FIG. 1 is a plan view showing a semiconductor device 1 according to a first embodiment of the present disclosure. FIG. 2 is a plan view showing the semiconductor device 1 without an encapsulating material 5. FIG. 3 is a plan view showing an enlarged portion of the semiconductor device 1 shown in FIG. 2. FIG. 4 is a front view showing one of terminal blocks shown in FIG. 3 viewed in a Y-axis direction. FIG. 5 is a cross section showing the semiconductor device 1 taken along line A-A shown in FIG. 1. FIG. 6 is a cross section showing an enlarged claw 190 shown in FIG. 5.

In the following, a right-handed coordinate system is assumed to explain a configuration of the semiconductor device 1. The right-handed coordinate system includes the X-axis, the Y-axis, and the Z-axis. The X-axis is parallel to a longitudinal direction of the semiconductor device 1 (cooler). The Y-axis is parallel to a lateral direction of the semiconductor device 1 (cooler). The Z-axis parallel to a height direction (a thickness direction of a substrate) of the semiconductor device 1 (cooler). The longitudinal direction of the semiconductor device 1 is a direction in which a plurality of modules (semiconductor modules) 2 are arranged. The X direction may be referred as a left-right direction. The Y direction may be referred as a front-back direction. The Z direction may be referred to as an up-down direction. These directions (left-right, front-back, and up-down directions) are used for convenience of explanation. The relationship between these directions and the X, Y, and Z directions may vary in accordance with the orientation of the semiconductor device 1. In the following description, plan view means an upper surface or a lower surface of the semiconductor device 1 viewed in the Z direction.

The semiconductor device 1 is, for example, used in a power conversion device, such as a power control unit. The semiconductor device 1 is, for example, a power semiconductor module, such as an inverter circuit. As shown in FIGS. 1 to 5, the semiconductor device 1 includes the plurality of modules 2 (three modules 2 in this embodiment), a cooler 3 configured to cool the plurality of modules 2, a case 4 containing the plurality of modules 2, and an encapsulating material 5 filling the case 4.

A module 2 includes an insulating substrate 6 and a semiconductor element 7 on the insulating substrate 6. In this embodiment, the three modules 2 are arranged in the X direction. The three modules 2 include, for example, a module for a U-phase, a module for a V-phase, and a module for a W-phase that are arranged in the +X direction to form a three-phase inverter circuit as a whole.

The cooler 3 includes a baseplate 8 that has a shape of a rectangle in plan view. The baseplate 8 is a plate-shaped member with a predetermined thickness. The baseplate 8 has a longitudinal direction, which is parallel to the left-right direction of the semiconductor device 1 (X direction). The baseplate 8 has a lateral direction, which is parallel to the front-back direction of the semiconductor device 1 (Y direction). The baseplate 8 has a first surface (lower surface) and a second surface (upper surface). The first surface is used to radiate heat generated in the modules 2. The second surface is bonded to the modules 2.

The baseplate 8 is made of a material that has excellent heat dissipation, such as an aluminum material or a copper material. Alternatively, the baseplate 8 may be made of an aluminum alloy or a copper alloy. In addition, the baseplate 8 is covered by a plating layer. The plating layer is preferably made of a metal plating such as a nickel plating. On the upper surface of the baseplate 8, the insulating substrate 6 is disposed via a bonding material S1, such as a solder material, etc. On the lower surface of the baseplate 8, a plurality of fins may be provided.

The insulating substrate 6 may include, for example, a direct copper bonding (DCB) substrate, an active metal brazing (AMB) substrate, or a metal based substrate. Specifically, the insulating substrate 6 includes an insulating plate 60, which has a lower surface and an upper surface, a heat sink 61 on the lower surface of the insulating plate 60, and a plurality of circuit boards 62 on the upper surface of the insulating plate 60. The insulating substrate 6 has a shape of a rectangle in plan view, for example.

The insulating plate 60 may be made of, for example, an insulating material, such as a ceramic material, a resinous material, an epoxy resin material, etc. The ceramic material is, for example, an alumina ($Al_2O_3$) material, an aluminum nitride (AlN) material, or a silicon nitride ($Si_3N_4$) material, etc. The resinous material is, for example, an epoxy material. In the epoxy resin material, a ceramic material is used as a filler.

The heat sink 61, which has a thickness in the Z direction, covers the lower surface of the insulating plate 60. The heat sink 61 is made of a thermally conductive metal plate such as, for example, a copper material or an aluminum material.

The plurality of circuit boards 62 are disposed on the upper surface of the insulating plate 60. In FIG. 2, for convenience of explanation, three circuit boards 62 are disposed per insulating substrate 6. One or more circuit boards 62 may be disposed on the upper surface of the insulating plate 60. These circuit boards 62 each include a metal layer, such as copper foil. The circuit boards 62, which each have a shape of an island, are disposed on the insulating plate 60 in a state in which the circuit boards 62 are electrically insulated from each other. The circuit boards 62 may be each referred to as a circuit layer.

The insulating substrate 6 (circuit board 62) has an upper surface on which the semiconductor element 7 is disposed via a bonding material S1, such as a solder material, etc. In FIG. 2, for convenience of explanation, two semiconductor elements 7 are shown per insulating substrate 6. Three or more semiconductor elements 7 may be disposed on the insulating substrate 6. The semiconductor element 7 is made of a semiconductor substrate that includes a material, such as, a silicon (Si) material, a silicon carbide (SiC) material, a gallium nitride (GaN) material, a diamond material, etc. The semiconductor element 7 has a shape of a square in plan view or has a shape of a rectangle.

The semiconductor element 7 includes a switching element, such as an insulated gate bipolar transistor (IGBT), a power metal oxide semiconductor field effect transistor (MOSFET), and a diode, such as a freewheeling diode (FWD). The switching element and the diode may be connected in reverse parallel to each other. The semiconductor element 7 may include a reverse conducting (RC)-IGBT element, in which IGBT and FWD are integrated, a power MOSFET element, or a reverse blocking (RB)-IGBT with a sufficient withstand voltage against reverse bias, etc.

The shapes of the semiconductor elements 7, the number of semiconductor elements 7, and the locations of the semiconductor elements 7 may be changed as appropriate. The semiconductor element 7 according to this embodiment is a vertical switching element in which a functional element, such as a transistor, is formed on a semiconductor substrate. However, the semiconductor element 7 is not limited thereto, and it may be a horizontal switching element.

The semiconductor element 7 includes an upper electrode that is electrically connected to the circuit board 62 via a metal wiring plate 10. The metal wiring plate 10 is formed by bending a metal material, such as a copper material, a copper alloy-based material, an aluminum alloy-based material, an iron alloy-based material, etc., by press working, etc. For example, the semiconductor element 7 and one end of the metal wiring plate 10 are coupled to each other by a bonding material S1, such as a solder material, etc. The circuit board 62 and the other end of the metal wiring plate 10 are coupled to each other by a bonding material S1, such as a solder material, etc. The metal wiring plate 10 may be referred to as a lead frame.

Figure 7:
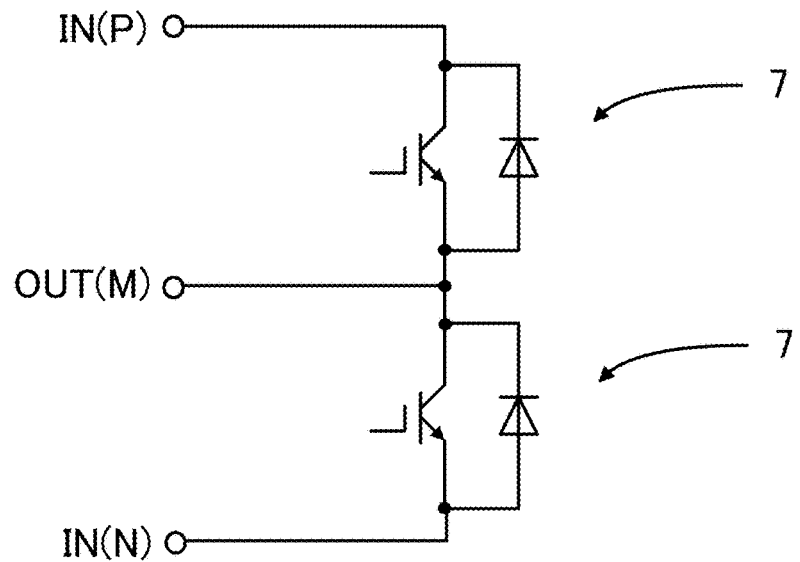
FIG. 7 is a circuit diagram showing an example of a circuit configured by a module 2 shown in FIG. 2.

An inverter circuit as shown in FIG. 7 may be constituted by the module 2 described above, specifically, the metal wiring plate 10, the plurality of circuit boards 62, and the semiconductor element 7. In this case, in FIG. 7, "P" represents a positive terminal, "N" represents a negative terminal, "M" represents an intermediate terminal, and an example of a configuration is described in which two semiconductor elements 7 are connected in series to each other.

On an outer periphery of the upper surface of the baseplate 8, the case 4 is disposed. The case 4 is a rectangular frame-shaped member that has an opening 4a in the center of the case 4. In the opening 4a, which has a shape of a rectangle, the three modules 2 described above are positioned. In other words, the case 4 surrounds a space in which the three modules 2, which each include the semiconductor elements 7, are positioned. The case 4 has a shape of a rectangle along the outer shape of the baseplate 8. The case 4 is bonded to the baseplate 8 by an adhesive S2. The space on the baseplate 8, which is surrounded by the case 4, is filled with the encapsulating material 5. As shown in FIG. 5, the adhesive S2 on the baseplate 8 protrudes from the case 4. This improves a bond of the case 4 to the baseplate 8.

The case 4 includes a thermoplastic resin and a filler. The thermoplastic resin is, for example, a polyphenylene sulfide resin, a polybutylene terephthalate resin, a polybutylene succinate resin, a polyamide resin, or an acrylonitrile butadiene styrene resin. The filler includes, for example, a glass material, a silicon dioxide material, an aluminum oxide material, a boron nitride material, or an aluminum nitride material. The inner wall surface of the case 4 may be covered by a coating film to improve adhesion. The coating film includes, for example, a polyamide resin or a polyamide-imide resin.

The encapsulating material 5 includes a thermosetting resin and a filler. The thermosetting resin is, for example, an epoxy resin, a phenolic resin, or a maleimide resin. The filler includes, for example, a glass material, a silicon dioxide material, an aluminum oxide material, a boron nitride material, or an aluminum nitride material.

The adhesive S2 mainly includes an organic adhesive. An example of the adhesive S2 is an epoxy resin, a silicone resin, or an acrylic resin. The adhesive S2 includes a filler. The ratio of filler to the adhesive S2 is not only less than the ratio of filler to the case 4, but also less than the ratio of filler to the encapsulating material 5. The adhesive S2 may not include a filler. Accordingly, the adhesive S2 has a coefficient of thermal expansion that is greater than that of each of the case 4 and the encapsulating material 5.

The case 4 includes main terminals (P terminals 16, N terminals 17, and M terminals 18) for external connection, and control terminals 19. The case 4 has walls 40 and 41, which face each other in the lateral direction (Y direction). The wall 40 is spaced apart from the wall 41 in the −Y direction. The wall 41 is spaced apart from the wall 40 in the +Y direction. The wall 40 includes recesses 42 and 43, which each have a shape of a quadrilateral in plan view. The wall 41 includes recesses 44, which each have a shape of a quadrilateral in plan view.

The P terminal 16 (a nut 16a described below) is disposed in the recess 42. The N terminal 17 (a nut 17a described below) is disposed in the recess 43. The M terminal 18 (a nut 18a described later) is disposed in the recess 44. The P terminal 16, the N terminal 17, and the M terminal 18 are disposed per module 2. The P terminal 16, the N terminal 17 and the M terminal 18 are each connected to the circuit board 62 of the insulating substrate 6 via a bonding material S1, such as a solder material, etc.

The P terminal 16 is formed by integrally molding the nut 16a, which is a square nut through which a threaded hole 16c passes, and a plate member 16b. The nut 16a is provided on one end portion (proximal end) of the plate member 16b. The plate member 16b has a shape of a plate with an upper surface and a lower surface. The plate member 16b has a shape elongated in the Y direction in plan view. The other end portion (distal end) of the plate member 16b is bonded to the circuit board 62 of the insulating substrate 6 by the bonding material S1.

Similar to the P terminal 16, the N terminal 17 is formed by integrally molding the nut 17a, which is a square nut through which a threaded hole 17c passes, and a plate member 17b. Similar to the P terminal 16, the M terminal 18 is formed by integrally molding the nut 18a, which is a square nut through which a threaded hole 18c passes, and a plate member 18b.

The P terminal 16 may be referred to as a positive terminal (input terminal). The N terminal 17 may be referred to as a negative terminal (output terminal). The M terminal 18 may be referred to as an intermediate terminal (output terminal). These terminals are included in the metal wiring plate 10 through which a main current flows. One end of the P terminal 16, one end of the N terminal 17, and one end of the M terminal 18 are each a main terminal capable of being connected to an external conductor. Whereas, the other end of the P terminal 16, the other end of the N terminal 17, and the other end of the M terminal 18 are each coupled to a circuit board 62 of the insulating substrate 6 via the bonding material S1. The P terminal 16, the N terminal 17, and the M terminal 18 correspond to "P", "N", and "M" shown in FIG. 6, respectively.

These terminals are formed of a metallic material such as, a copper material, a copper alloy-based material, an aluminum alloy-based material, an iron alloy-based material, etc. The shapes of these terminals, the locations of these terminals, and the number of terminals are not limited thereto, and may be changed as appropriate.

The wall 41 of the case 4 includes claws 190. As shown in FIGS. 5 and 6, the wall 41 has inner wall surfaces 193 and 194. The claw 190 includes a protrusion 191, which protrudes from the inner wall surfaces 193 and 194 of the case 4 toward the semiconductor element 7. In addition, the claw 190 includes a hook 192, which extends from the protrusion 191 and is inclined from the protrusion 191. A space 190S is sandwiched between the inner wall surface 194 of the case 4 and the hook 192.

In an example shown in FIGS. 5 and 6, the protrusion 191 has a tip in the −Y direction. The tip of the protrusion 191 (in the −Y direction) has a lower surface (XY plane in the −Z direction). The hook 192 extends from the lower surface of the tip of the protrusion 191 toward the baseplate 8 (−Z direction). More specifically, the hook 192 is inclined at an angle of 90 degrees from the protrusion 191, and the hook 192 extends in a direction (−Z direction) toward the baseplate 8. The thickness of the protrusion 191 (length in the Z direction) is greater than the thickness of the hook 192 (length in the Y direction). This is because the protrusion 191, which is used as a terminal block, as described below, is required to generate a force against a force received when a wiring member W is coupled to the protrusion 191, whereas the hook 192 is not required to generate such a force. The thickness of the hook 192 (length in the Y direction) is less than a distance between the hook 192 and the inner wall surface 194 in the example shown in FIGS. 5 and 6. However, the thickness of the hook 192 may be greater than the distance between the hook 192 and the inner wall surface 194.

The claw 190 includes a first inner surface 195 and a third inner surface 197. The case 4 includes a second inner surface 196. In this embodiment, a roughening treatment is applied to the first inner surface 195, the second inner surface 196, and the third inner surface 197. In other words, the first inner surface 195, the second inner surface 196, and the third inner surface 197 are rougher than another inner wall surface of the case 4. The first inner surface 195 is an inner surface facing the inner wall surface 194 of the case 4. The second inner surface 196 is an inner surface of the case 4 facing the first inner surface 195 (i.e., a portion of the inner wall surface 194 facing the first inner surface 195). The third inner surface 197 is an inner surface facing a space sandwiched between the first inner surface 195 and the second inner surface 196. The roughening treatment is applied to enhance the adhesion of the encapsulating material 5 in the case 4 to the first inner surface 195, the second inner surface 196, and the third inner surface 197, thereby substantially preventing the expansion of the detachment of the encapsulating material 5.

In this embodiment, the protrusion 191, which is part of the claw 190, is the terminal block that includes terminals 19 electrically connected to the semiconductor element 7 through the wiring member W. In this embodiment, all terminal blocks are each the protrusion 191 of the claw 190. In other words, in this embodiment, the claw 190 is formed only in a region in which the terminal block is formed.

In an example shown in FIGS. 2 and 3, two claws 190 are arranged per module 2. More specifically, in a module 2, two claws 190 are arranged so that an M terminal 18 is sandwiched between the two claws 190 in the left-right direction (X direction). In this embodiment, as shown in FIG. 3, the inner wall surface of the case 4 includes a region, on which the claw 190 is disposed, and a region 199, on which no claw is disposed. The region 199 is at each of sides of the region on which the claw 190 is disposed. This is allowed to move a void (bubble), which has occurred in the encapsulating material 5 between the claws 190 and the baseplate 8, to an area over the claw 190 in the case 4 along the region 199 to release the void.

In this embodiment, as shown in FIGS. 5 and 6, the inner wall surface of the case 4 has an inner wall surface 193 and an inner wall surface 194. The inner wall surface 193, which is farther from the baseplate 8 than the protrusion 191, extends in the +Z direction (direction away from the baseplate 8). The inner wall surface 194, which is closer to the baseplate 8 than the protrusion 191, extends in the −Z direction (direction toward the baseplate 8). The inner wall surface 194 is retracted from the inner wall surface 193 in a direction toward an outer wall surface of the case 4 (+Y direction). In other words, the inner wall surface 194 is closer to the outer wall surface of the case 4 than the inner wall surface 193.

Thus, the inner wall surface 194 is positioned in the +Y direction apart from the inner wall surface 193. Accordingly, it is possible to provide a space for containing the insulating substrate 6 at an area positioned in the −Z direction apart from the claws 190. According to this configuration, the insulating substrate 6 only need to be disposed on the baseplate 8 so that the insulating substrate 6 is positioned at a predetermined distance or more from the inner wall surface 194 retracted in the +Y direction. Accordingly, the protrusion 191 of the claw 190 can be closer to the semiconductor element 7 compared to a configuration in which the inner wall surface 194 is not retracted in the +Y direction from the inner wall surface 193, resulting in reducing a distance between the semiconductor element 7 and a junction of the terminal 19 to the wiring member W. Therefore, the wiring member W, which electrically connects the semiconductor element 7 to the terminal 19, can be shortened to substantially prevent deformation of the wiring member W or damage to the wiring member W.

The wall 41 of the case 4 includes a portion with a surface on which a pair of claws 190 is disposed. The pair of claws 190 includes a pair of terminal blocks. The portion of the wall 41 has an upper surface on which a pair of pillars 41a is disposed. The pair of pillars 41a vertically protrudes in the +Z direction. The pair of pillars 41a is disposed such that the M terminal 18 is sandwiched between the pillars 41a. The pillar 41a has an upper surface and an inside surface (−Y side). The inside surface of the pillar 41a has a portion, which is away from the upper surface of the pillar 41a in the −Z direction by one step. The protrusion 191 of the claw 190 is disposed on the portion of the inside surface of the pillar 41a. A pair of protrusions 191 is disposed per module 2 such that the M terminal 18 is sandwiched between the protrusions 191 in the left-right direction (X direction).

The terminal 19 is made of a metal material, such as a copper material, a copper alloy-based material, an aluminum alloy-based material, an iron alloy-based material, etc. The terminals 19 are integrally molded (insert molded) to be embedded in the case 4.

More specifically, five terminals 19 are embedded not only in a protrusion 191 that is a terminal block, but also in a pillar 41a. The terminal 19 has a roughly L-shaped in cross section taken along the YZ plane. The terminal 19 includes an inner terminal 19a (one end portion of the terminal), which is connected to the semiconductor element 7, and an outer terminal 19b (the other end portion of the terminal) for external connection. The terminal 19, in which the inner terminal 19a is continuous with the outer terminal 19b, has an L-shape in side view.

The inner terminal 19a, which is one end portion of the terminal 19, has a shape of a flat plate along a surface of the semiconductor element 7. The inner terminal 19a has a longitudinal direction along the Y direction and a thickness direction along the Z direction. Most of the inner terminal 19a in the thickness direction of the inner terminal 19a is embedded in the protrusion 191. The inner terminal 19a extends from the inner surface of the case 4 (opening 4a) in the −Y direction to reach the tip of the protrusion 191 in the −Y direction. An upper surface of the inner terminal 19a is flush with an upper surface of the protrusion 191. The term "flush" means that two surfaces are located in the same plane. The phrase "two surfaces are located in the same plane" means not only that the two surfaces are located in exactly the same plane, but also that one of the two surfaces is away from the other of the two surfaces within a range of a manufacturing error. Accordingly, the upper surface of the inner terminal 19a is exposed. The upper surface of the inner terminal 19a is electrically connected to the semiconductor element 7 by the wiring member W. The wiring member W is a wire and is coupled to the inner terminal 19a by ultrasonic welding.

As the wiring member W, a conductive wire (bonding wire) is used. The material of the conductive wire may be any one of a gold material, a copper material, an aluminum material, a gold alloy material, a copper alloy material, or an aluminum alloy material, or a combination thereof. As the wiring member W, a member other than a conductive wire may be used. For example, a ribbon cable may be used as the wiring member W.

The outer terminal 19b, which is the other end portion of the terminal 19, extends vertically and is continuous with the inner terminal 19a in the case 4 (see FIG. 5). The outer terminal 19b, which extends upwardly, has an intermediate portion (base end) that is embedded in the pillar 41a. On the other hand, the outer terminal 19b has an upper end portion (tip) that protrudes from the upper surface of the pillar 41a by a predetermined distance. The cross section of the outer terminal 19b may have a shape of a polygon or may have the shape of a circle. The outer terminal 19b may include a press-fit pin.

The case 4 has a plurality of through holes 20 along an outer periphery of the case 4. The through hole 20 is a hole in which a screw (not shown) is inserted to fix the semiconductor device 1. The through hole 20 passes through the baseplate 8.

As described above, the space surrounded by the frame-shaped case 4 is filled with the encapsulating material 5. Thus, the insulating substrate 6 and the semiconductor element 7, which is mounted on the insulating substrate 6, are encapsulated in the space described above.

The semiconductor device 1 according to this embodiment is described above in detail. In this embodiment, to enhance the bonding of the case 4 to the baseplate 8, the adhesive S2, which bonds the case 4 to the baseplate 8, protrudes from the case 4. However, when the adhesive S2 protrudes from the case 4, an interface between the protruding adhesive S2 and the encapsulating material 5 arises. Accordingly, the detachment of the encapsulating material 5 from the case 4 starts easily. In addition, a point arises at which the adhesive S2, the baseplate 8, and the encapsulating material 5 are in contact with each other. Accordingly, the point tends to become a starting point of detachment. In this embodiment, however, the case 4 includes the claw 190 including: the protrusion 191 protruding from the inner wall surface of the case 4; and the hook 192 inclined from the protrusion 191, a space being sandwiched between the hook 192 and the inner wall surface of the case 4. The protrusion 191 of the claw 190 prevents vertical movement of the encapsulating material 5. In addition, the hook 192 of the claw 190 prevents horizontal movement of the encapsulating material 5 in the space 190S. Accordingly, it is possible for the claw 190 to substantially prevent detachment of the encapsulating material 5 and the case 4 due to the adhesive S2 expanding from the neighborhood of the baseplate 8. In addition, according to this embodiment, the claw 190 includes the hook 192. Accordingly, creepage distance from the baseplate 8 to the terminal 19 can be increased compared to a configuration without the hook 192.

In this embodiment, the hook 192 of the claw 190 extends toward the baseplate 8. Accordingly, the expansion of the detachment from the baseplate 8 can be effectively prevented.

In this embodiment, the inner wall surface of the case 4 includes the inner wall surface 194, which is an example of a first region, and the inner wall surface 193, which is an example of a second region. The inner wall surface 194 is closer to the baseplate 8 than the protrusion 191. The inner wall surface 193 is farther from the baseplate 8 than the protrusion 191. The inner wall surface 194 is closer to the outer wall surface of the case 4 than the inner wall surface 193. According to this configuration, the claw 190, which includes the protrusion 191 that is the terminal block, can be close to the insulating substrate 6, resulting in reducing distance between the semiconductor element 7 and the junction of the terminal 19 to the wiring member W. Therefore, the wiring member W, which electrically connects the semiconductor element 7 and the terminal 19 to each other, can be shortened to prevent deformation of the wiring member W or to prevent damage to the wiring member W.

In this embodiment, the claw 190 includes the first inner surface 195 and the third inner surface 197. The case 4 includes the second inner surface 196. The first inner surface 195 faces the inner wall surface of the case 4. The second inner surface 196 faces the first inner surface 195. The third inner surface 197 faces the space sandwiched between the first inner surface 195 and the second inner surface 196. A roughening treatment is applied to the first inner surface 195, the second inner surface 196, and the third inner surface 197. In other words, the first inner surface 195, the second inner surface 196, and the third inner surface 197 are rougher than another inner wall surface of the case 4. Accordingly, it is possible to enhance the adhesion of the encapsulating material 5, which fills the case 4, to the first inner surface 195, the second inner surface 196, and the third inner surface 197, resulting in improving an advantage in substantially preventing the expansion of the detachment of the encapsulating material 5.

In this embodiment, the protrusion 191 of the claw 190 is the terminal block including the terminal 19 electrically connected to the semiconductor element 7 via the wiring member W. Each terminal block is a protrusion 191 of the claw 190. Accordingly, it is possible to effectively prevent the expansion of the detachment along the surface of the terminal block, resulting in preventing damage such as disconnection of the wiring member W.

In this embodiment, the inner wall surface of the case 4 includes a region on which the claw 190 including the terminal block is disposed, and the region 199 on which no claw is disposed, the region 199 being at each of the sides of the region on which the claw 190 is disposed. According to this configuration, it is possible to move a void (bubble), which has occurred in the encapsulating material 5 that fills the case 4, to an upper area (area far from the baseplate 8) in the case 4 along the region 199 to release the void, resulting in avoiding the void remaining in an area below the claw 190 (area adjacent to the baseplate 8).

Second Embodiment

Figure 8:
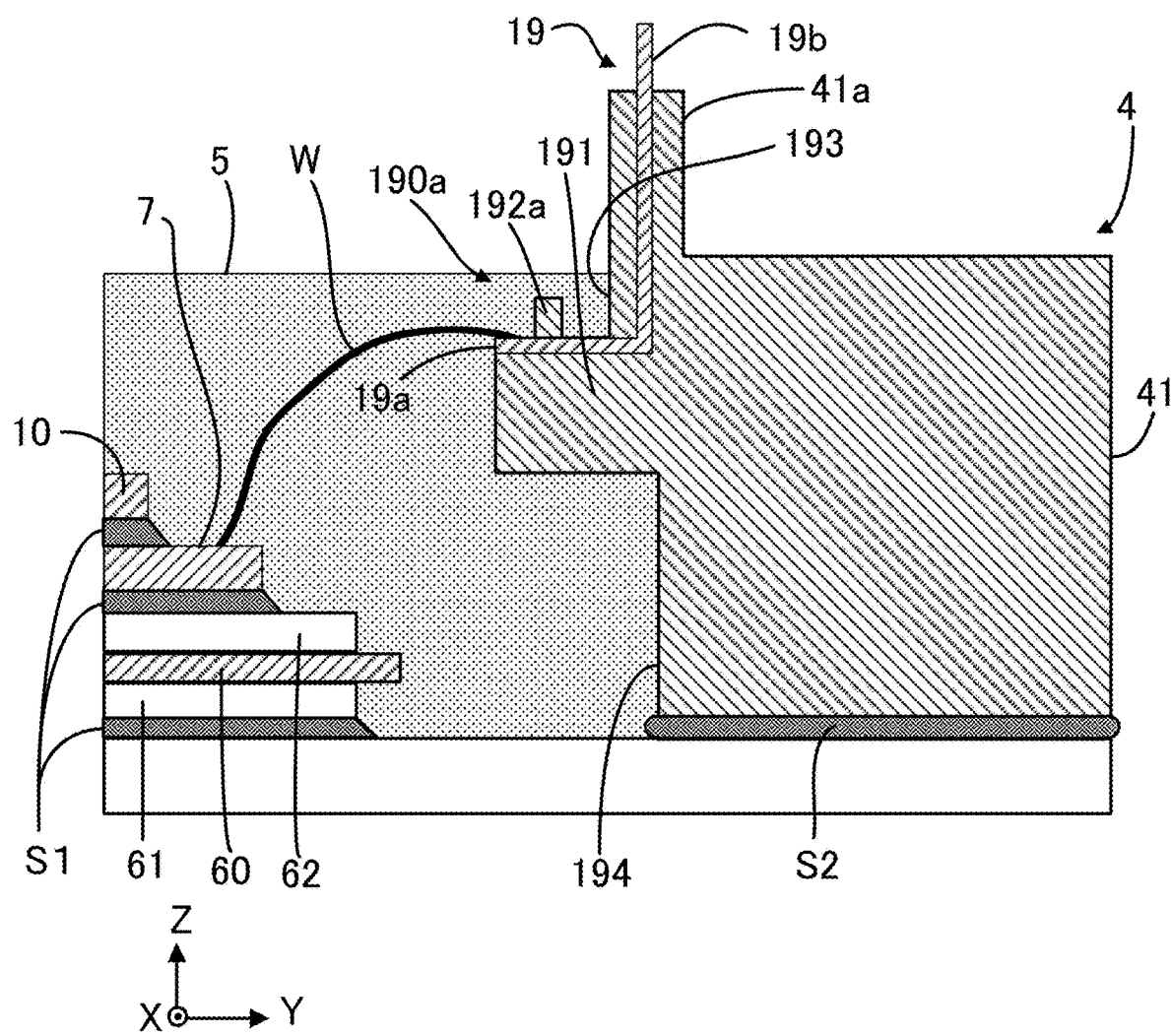
FIG. 8 is a cross section showing a claw 190a of a semiconductor device according to a second embodiment.

FIG. 8 is a cross section showing a claw 190a of a semiconductor device according to a second embodiment. The claw 190 in the first embodiment includes the hook 192, which is inclined from the protrusion 191, protruding in the −Z direction (direction toward the baseplate 8) from the tip of the protrusion 191. In contrast, the claw 190a in this embodiment includes a hook 192a, which is inclined from the protrusion 191, protruding in the +Z direction (direction away from the baseplate 8) from the middle of the protrusion 191. A space is sandwiched between the hook 192a and the inner wall surface 193 of the case 4.

In this embodiment, the protrusion 191 of the claw 190a prevents the vertical movement of the encapsulating material 5, and the hook 192a of the claw 190a prevents the horizontal movement of the encapsulating material 5 in the space between the inner wall surface 193 and the hook 192a, as in the first embodiment. Accordingly, it is possible for the claw 190a to substantially prevent detachment of the encapsulating material 5 and the case 4 due to the adhesive S2 expanding from the neighborhood of the baseplate 8. To increase the creepage distance from baseplate 8 to the terminal 19, the first embodiment (see FIGS. 5 and 6), in which the hook 192 extends in the −Z direction, is more advantageous than the second embodiment. However, since the hook 192a extends in the +Z direction (direction away from the baseplate 8), the second embodiment is advantageous for confirming (e.g., visual recognition) the condition of the inner wall surface 194.

Third Embodiment

Figure 9:
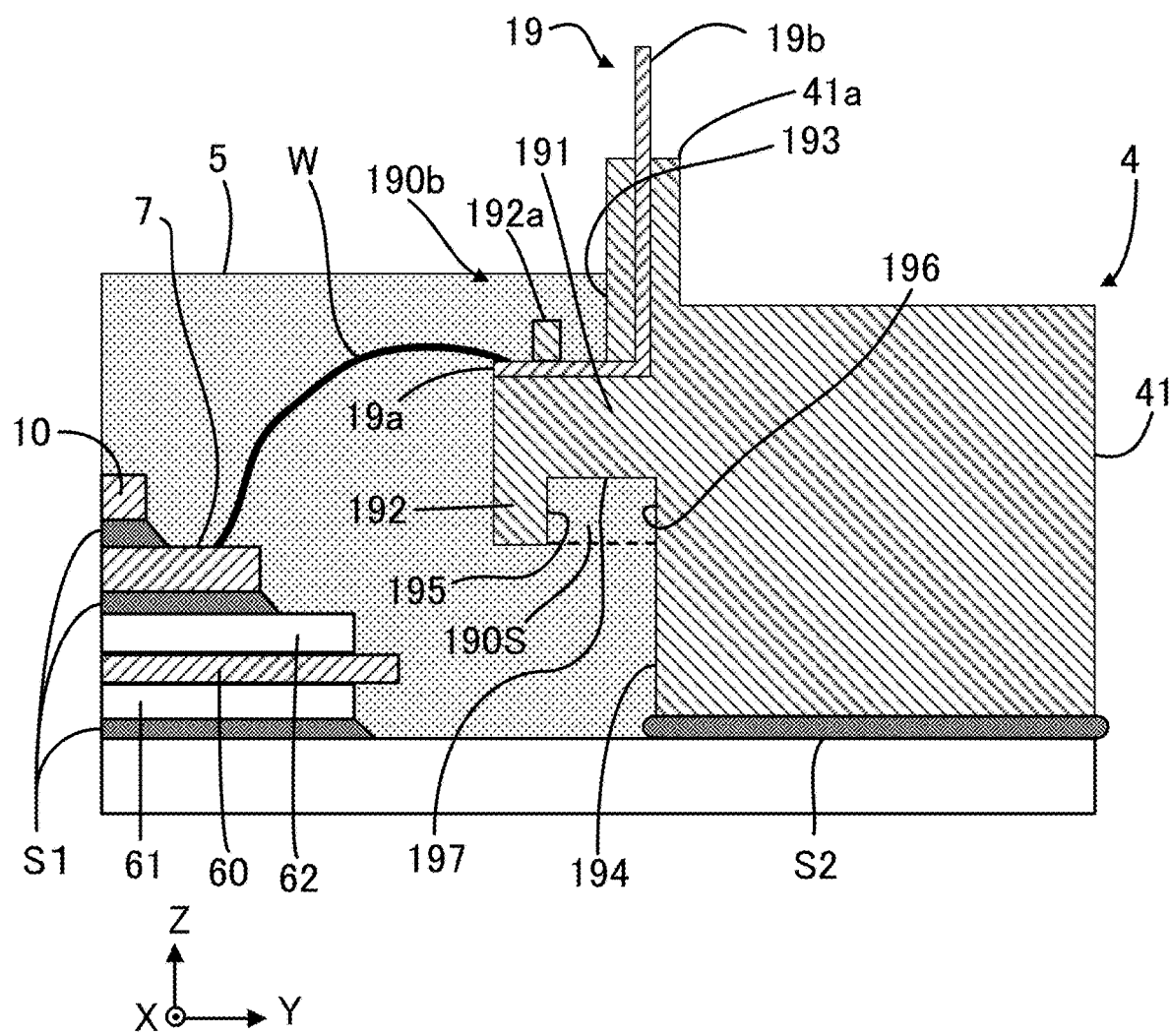
FIG. 9 is a cross section showing a claw 190b of a semiconductor device according to a third embodiment.

FIG. 9 is a cross section showing a claw 190b of a semiconductor device according to a third embodiment. The claw 190b according to this embodiment has a configuration in which the hook 192a in the second embodiment is added to the claw 190 in the first embodiment. In other words, the claw 190b in this embodiment includes both the hook 192, which extends from the tip of the protrusion 191 in the direction toward the baseplate 8, and the hook 192a, which extends from the middle of the protrusion 191 in a direction opposite to the direction toward the baseplate 8.

According to this embodiment, the protrusion 191 prevents the vertical movement of the encapsulating material 5, and both of the hooks 192 and 192a prevent the horizontal movement of the encapsulating material 5. Accordingly, it is possible to more effectively prevent expansion of the detachment compared to each of the first and second embodiments described above.

Fourth Embodiment

Figure 10:
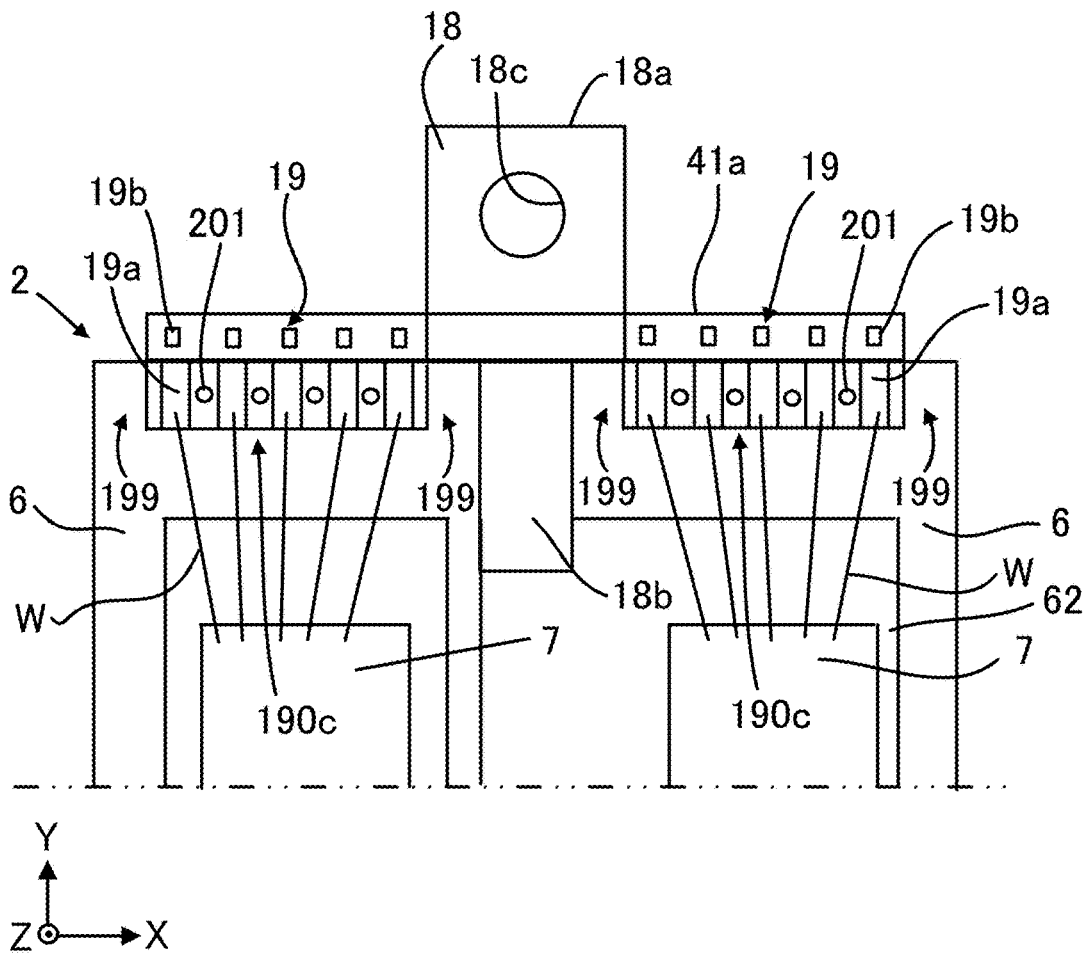
FIG. 10 is a plan view showing a claw 190c of a semiconductor device according to a fourth embodiment.

FIG. 10 is a plan view showing a claw 190c of a semiconductor device according to a fourth embodiment. The protrusion 191 of the claw 190c has a plurality of inner terminals 19a (five inner terminals 19a in this example) and one or more (four in this example) through holes 201. Each of the through holes 201 is between two adjacent inner terminals 19a in the protrusion 191. Each of the through holes 201 communicates with the space 190S (see FIGS. 5 and 6) between the hook 192 and the inner wall surface 194 of the case 4.

According to this configuration, it is possible to release a void, which has occurred in the encapsulating material 5 in a space between the claw 190c and the baseplate 8, through the through hole 201.

Figure 11:
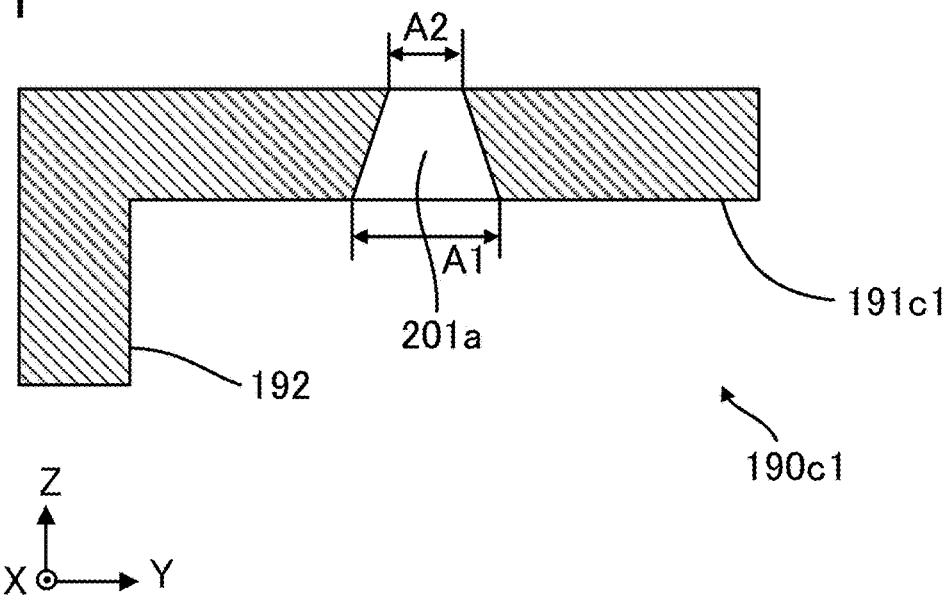
FIG. 11 is a cross section showing a claw 190c1, which is a first example of the claw 190c.

FIG. 11 is a cross section showing a claw 190c1, which is a first example of the claw 190c. The claw 190c1 includes a protrusion 191c1 with a through hole 201a. The through hole 201a has a first opening end and a second opening end. The first opening end is closer to the baseplate 8 than the second opening end. The through hole 201a has a tapered shape in which an opening area A2 of the second opening end is less than an opening area A1 of the first opening end.

In this configuration, pressure P1 described below is equal to pressure P2 described below (Pascal's law). The pressure P1 is required to push the encapsulating material 5 into an opening surface of the first opening end. The pressure P2 is required to push the encapsulating material 5 out of an opening surface of the second opening end. It is assumed that a force, which is required to push the encapsulating material 5 into the opening surface of the first opening end, is referred to as "F1." In addition, it is assumed that a force, which is required to push the encapsulating material 5 out of the opening surface of the second opening end, is referred to as "F2." In this case, the following formula holds.

$$P1=F1/A1=P2=F2/A2 \quad (1)$$

Accordingly, the force F2, which is required to push the encapsulating material 5 out of the opening surface of the second open end, is given by the following formula.

$$F2=F1*(A2/A1)>F1 \quad (2)$$

When air is passed from the first opening end, which has a large opening area, to the second opening end, which has a small opening area, the force F2, which is required to push the encapsulating material 5 out of the second opening end, is greater than the force F1, which is required to push the encapsulating material 5 into the first opening end. Accordingly, the voids in the encapsulating material 5 can be readily passed through, compared to a configuration in which the opening area of the first opening end is the same as the opening area of the second opening end.

Figure 12:
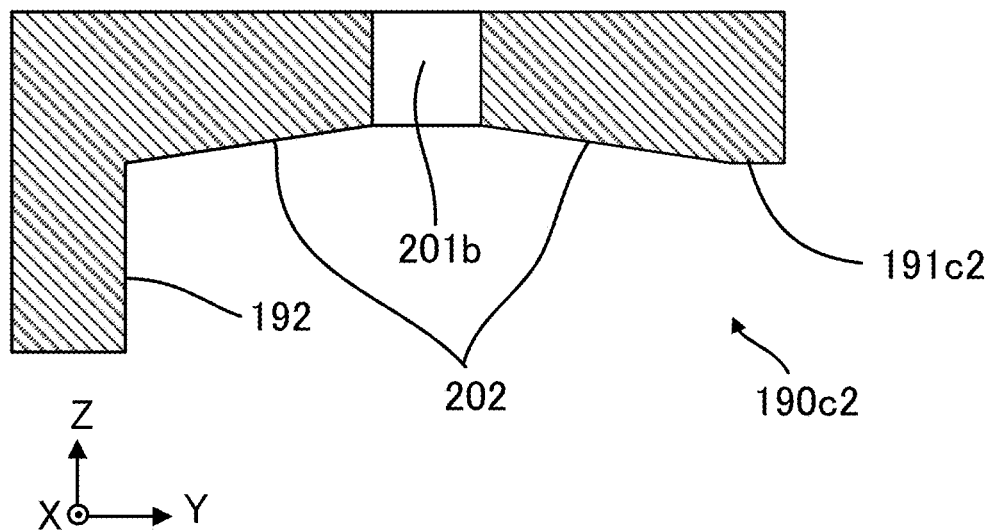
FIG. 12 is a cross section showing a claw 190c2, which is a second example of the claw 190c.

FIG. 12 is a cross section showing a claw 190c2, which is a second example of the claw 190c. The claw 190c2 includes a protrusion 191c2 with a through hole 201b. The through hole 201b has two opening ends that have the same opening area. The protrusion 191c2 of the claw 190c2 includes an opposing surface 202 facing the baseplate 8. The opposing surface 202 has a tapered shape in which a first distance is greater than a second distance. The first distance is a distance from a position of an opening end of the through hole 201b to the baseplate 8. The second distance is a distance from a position of a first portion of the opposing surface 202 to the baseplate 8. The first portion of the opposing surface 202 is a portion of the opposing surface 202 that is away from the opening end of the through hole 201b.

According to this configuration, a first force described below is greater than a second force described below (The reason is the same as the reason for the tapered through hole 201a). The first force is a force to push the encapsulating material 5 at the position of the opening end of the through hole 201b on the surface of the claw 190c2 facing the baseplate 8. The second force is a force to push the encapsulating material 5 on the surface of the claw 190c2 facing the baseplate 8 toward the opening end of the through hole 201b from the position of the first portion of the opposing surface 202. The first portion of the opposing surface 202 is a portion of the opposing surface 202 that is away from the opening end of the through hole 201b. Accordingly, a void in the encapsulating material 5 can readily pass through the through hole 201b compared to a configuration in which the opposing surface 202 is a flat surface without having a tapered shape. In addition, according to this configuration, a void, which has occurred in the encapsulating material 5 below the claw 190c2, moves along the opposing surface 202 with the tapered shape to be released through the through hole 201b. Accordingly, even in this point, the void in the encapsulating material 5 can readily pass through the through hole 201b compared to a configuration in which the opposing surface 202 is a flat surface without having a tapered shape.

Figure 13:
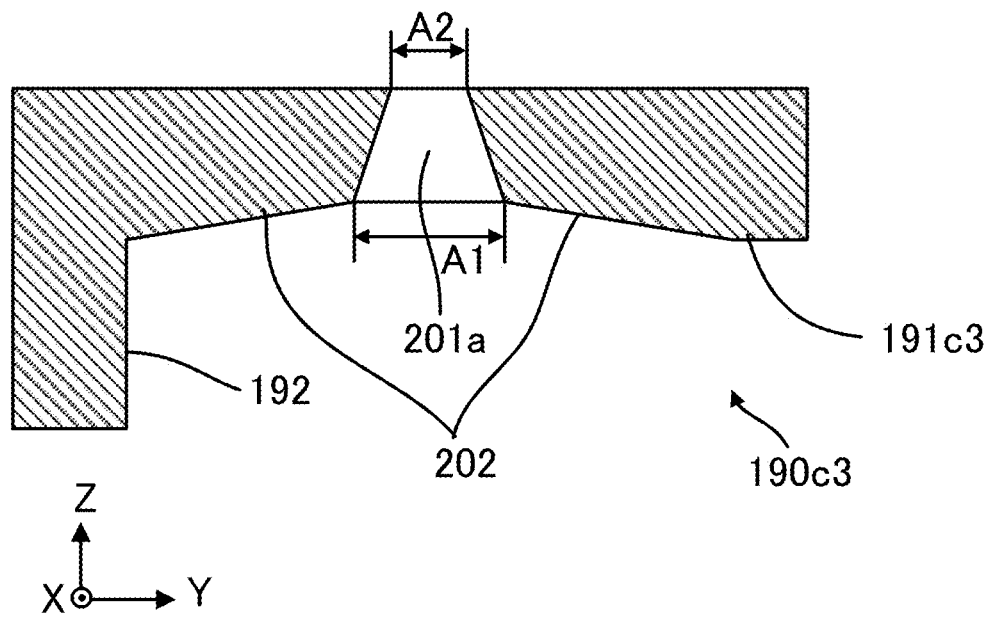
FIG. 13 is a cross section showing a claw 190c3, which is a third example of the claw 190c.

FIG. 13 is a cross section showing a claw 190c3, which is a third example of the claw 190c. The claw 190c3 has the features of the first and second examples. The claw 190c3 includes a protrusion 191c3 with the through hole 201a. The through hole 201a has the first opening end and the second opening end that is farther from the baseplate 8 than the first opening end. The through hole 201a has a tapered shape in which the opening area A2 of the second opening end is less than the opening area A1 of the first opening end. The protrusion 191c3 includes the opposing surface 202 facing the baseplate 8. The opposing surface 202 has a tapered shape in which a third distance is greater than a fourth distance. The third distance is a distance from a position of an opening end of the through hole 201a to the baseplate 8. The fourth distance is a distance from a position of a second portion of the opposing surface 202 to the baseplate 8. The second portion of the opposing surface 202 is a portion of the opposing surface 202 that is away from the opening end of the through hole 201a.

This example has the features of the first and second examples. Accordingly, the void in the encapsulating material 5 can be easily released through the through hole 201a compared to either the first example or the second example.

Fifth Embodiment

Figure 14:
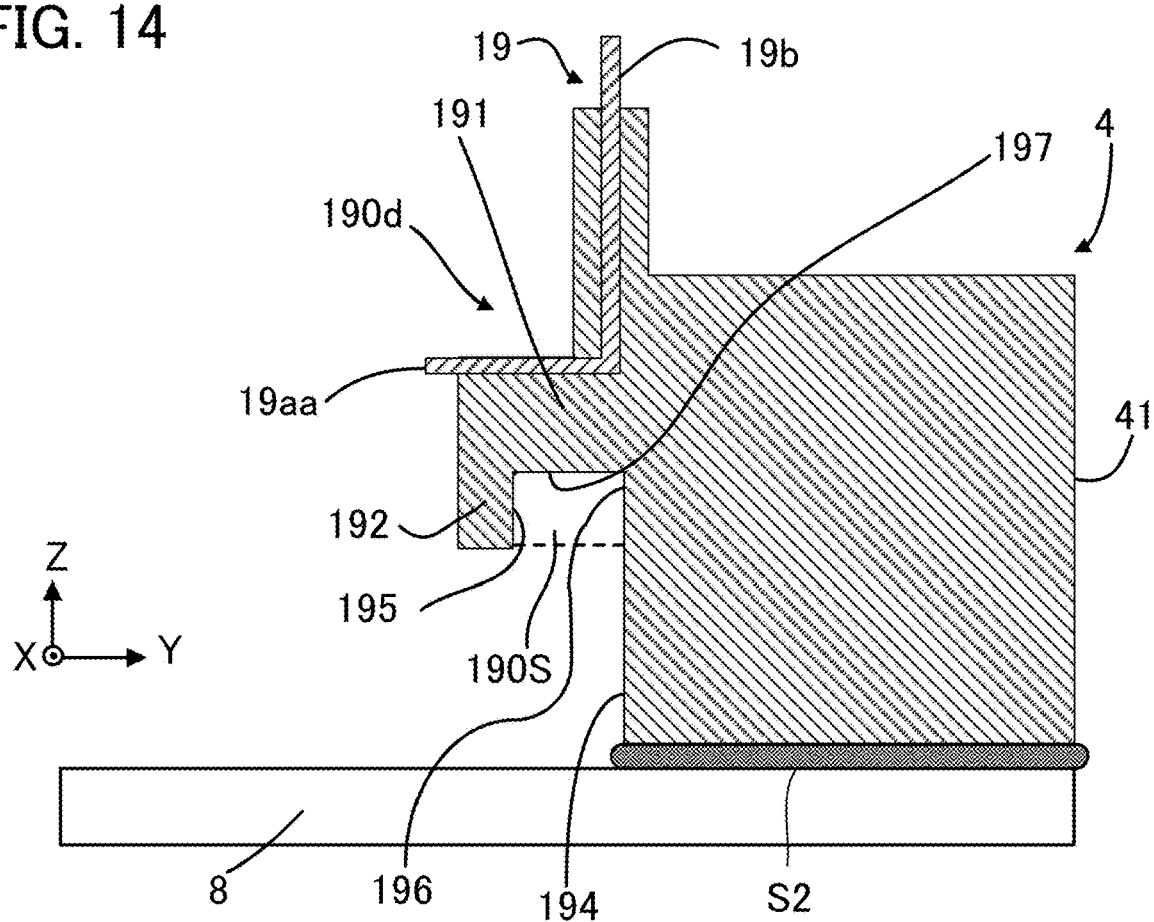
FIG. 14 is a cross section showing a claw 190d in a semiconductor device according to a fourth embodiment.

FIG. 14 is a cross section showing a claw 190d in a semiconductor device according to a fifth embodiment. In this claw 190d, an inner terminal 19aa protrudes from the tip of the protrusion 191 that is the terminal block. According to this configuration, the inner terminal 19aa, which protrudes from the protrusion 191, prevents the vertical movement of the encapsulating material 5 to substantially avoid the expansion of the detachment of the encapsulating material 5.

Figure 15:
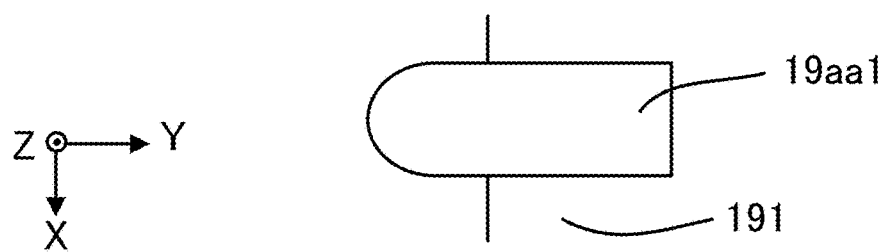
FIG. 15 is a plan view showing an inner terminal 19aa1, which is a first example of an inner terminal 19aa disposed on a protrusion 191 of the claw 190d.

FIG. 15 is a plan view showing an inner terminal 19aa1, which is a first example of the inner terminal 19aa disposed on the protrusion 191 of the claw 190d. The inner terminal 19aa1 has a portion, which protrudes from the tip of the protrusion 191 that is the terminal block, having a shape of a round plane. Accordingly, it is possible to substantially prevent the portion of the inner terminal 19aa1, which protrudes from the tip of the protrusion 191 that is the terminal block, from becoming a starting point of detachment of the encapsulating material 5.

Figure 16:
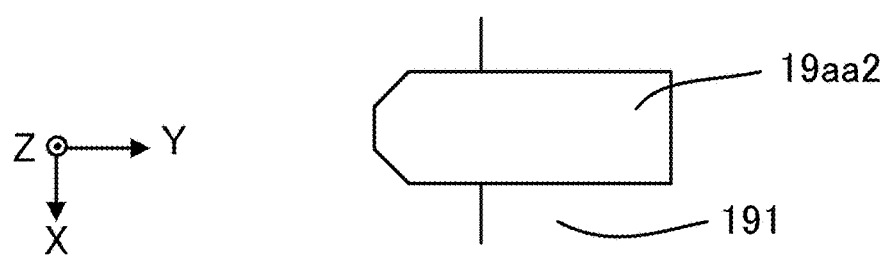
FIG. 16 is a plan view showing an inner terminal 19aa2, which is a second example of the inner terminal 19aa disposed on the protrusion 191 of the claw 190d.

FIG. 16 is a plan view showing an inner terminal 19aa2, which is a second example of the inner terminal 19aa disposed on the protrusion 191 of the claw 190d. The inner terminal 19aa2 has a portion, which protrudes from the tip of the protrusion 191 that is the terminal block, having a shape of a plane having a corner with an obtuse angle. Accordingly, it is possible to substantially prevent the portion of the inner terminal 19aa2, which protrudes from the tip of the protrusion 191 that is the terminal block, from becoming a starting point of detachment of the encapsulating material 5.

Other Embodiments

Although the first to fifth embodiments according to the present disclosure have been described above, the present disclosure may include other embodiments described below, for example.

(1) In each of the embodiments described above (particularly, in the first embodiment), the claw 190 is disposed on a region in the case 4 on which the terminal block is to be provided. However, the claw 190 may be disposed on another region.

(2) In each of the embodiments described above (particularly in the first embodiment), the inner terminal 19a of the terminal 19 is embedded in the protrusion 191 of the claw 190. However, the inner terminal 19a may be disposed on the upper surface of the protrusion 191, instead of being embedded in the protrusion 191. The inner terminal 19a may be extended to the middle of the protrusion 191 in a direction in which the protrusion 191 protrudes, instead of being extended to the tip of the protrusion 191 in the direction.

(3) In the first embodiment described above, the number of semiconductor elements 7 and the locations of the semiconductor elements 7 are not limited to those of the configurations described above and may be changed as appropriate.

(4) In the first embodiment described above, the number of circuit boards and the layout of the circuit boards are not limited to those of the configurations described above and may be changed as appropriate.

(5) In the first embodiment described above, the insulating substrate 6 and the semiconductor element 7 each have a shape of a rectangle in plan view or a shape of a rectangle. However, each of the insulating substrate 6 and the semiconductor element 7 is not limited to this configuration. The insulating substrate 6 and the semiconductor element 7 may each have a shape of another polygon.

(6) In the first embodiment described above, the configuration is described in which the module 2 for a U-phase, the module 2 for a V-phase, and the module 2 for a W-phase are arranged in the +X direction. However, the semiconductor device including these modules 2 is not limited to this configuration. The number and the orientation of lines of the modules 2 may be changed as appropriate. In addition, the case 4 is formed by including the three phases of the U-phase, the V-phase, and the W-phase. However, the case 4 is not limited thereto, and case 4 may be changed as appropriate. A case 4 may be formed for each module 2.

(7) In the fifth embodiment described above, the tip of the inner terminal 19aa, which is part of the terminal, protrudes from the protrusion 191 of the claw 190d. Alternatively, however, the tip of the inner terminal 19aa may protrude from a normal terminal block, which is not part of the claw 190d. According to this configuration, the inner terminal 19aa, which protrudes from the tip of the terminal block, prevents the vertical movement of the encapsulating material 5 to substantially avoid expansion of the detachment of the encapsulating material 5.

Thus, the semiconductor device may be a semiconductor device that includes: a baseplate; an insulating substrate on the baseplate; a semiconductor element on the insulating substrate, a case bonded to the baseplate by an adhesive, the case surrounding a space in which the semiconductor element is positioned; and an encapsulating material filling the space surrounded by the case, in which the case includes a terminal block including a terminal electrically connected to the semiconductor element via a wiring member, the terminal block protruding from an inner surface of the case, and the terminal protrudes from a tip of the terminal block.

Figure 17:
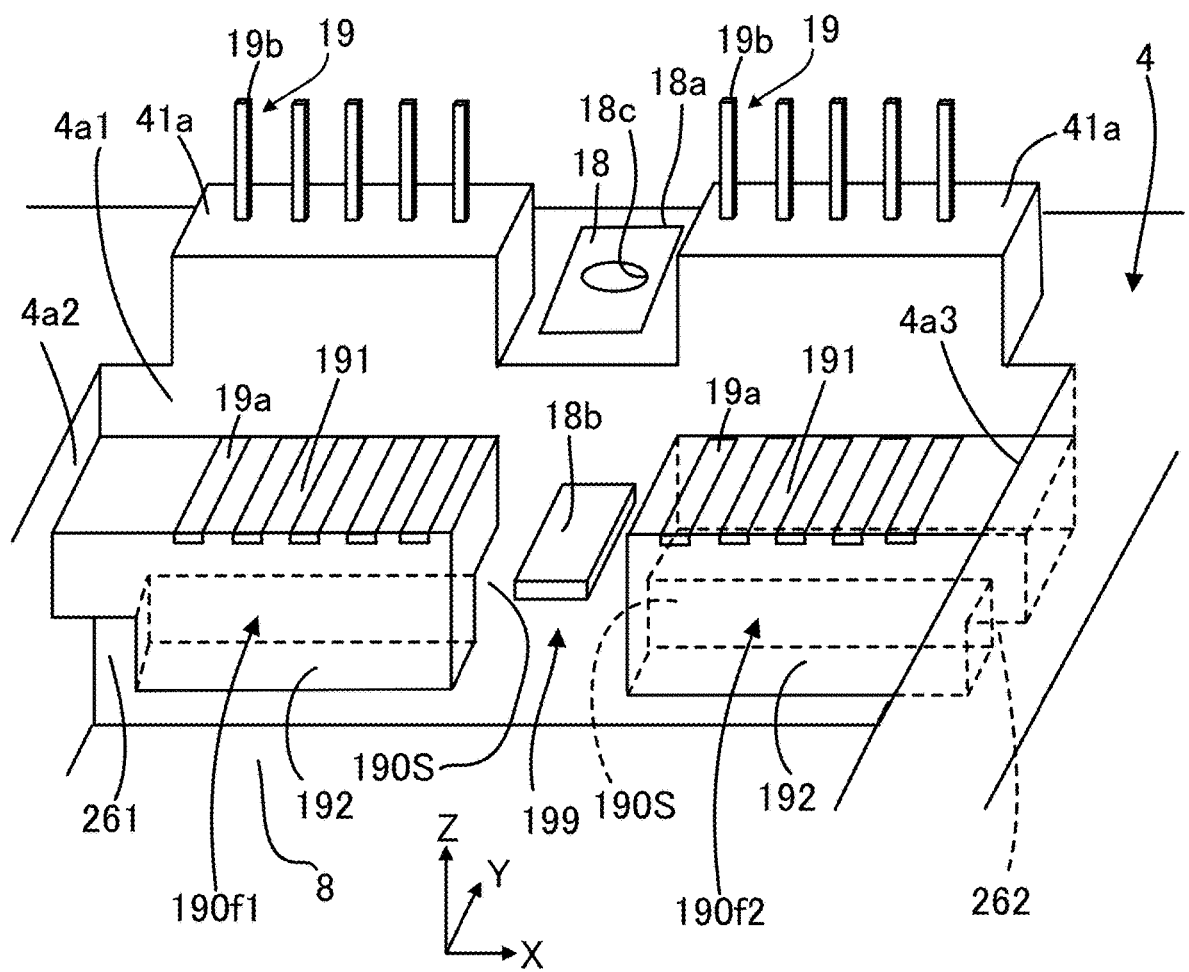
FIG. 17 is a perspective view showing claws 190f1 and 190f2 of a semiconductor device according to another embodiment.

FIG. 17 is a perspective view showing claws 190f1 and 190f2 of a semiconductor device according to another embodiment. In FIG. 17, the insulating substrate 6, the wiring member W, and the encapsulating material 5 are omitted to prevent the drawing from becoming complicated.

In FIG. 17, the case 4 includes a first inner wall surface 4a1, a second inner wall surface 4a2, and a third inner wall surface 4a3. A space, which faces the first inner wall surface 4a1, is sandwiched between the second inner wall surface 4a2 and the third inner wall surface 4a3. In an example shown in FIG. 17, the first inner wall surface 4a1 is parallel to the XZ plane. The second inner wall surface 4a2 and the third inner wall surface 4a3 are parallel to the YZ plane.

On the first inner wall surface 4a1, a first claw 190f1 and a second claw 190f2 are disposed. The first claw 190f1 and the second claw 190f2 are arranged in the X-axis direction. The first inner wall surface 4a1 includes a first region on which the first claw 190f1 is disposed, a second region on which the second claw 190f2 is disposed, and a region 199 on which no claw is disposed. The region 199, which is an example of a third region of the first inner wall surface 4a1, is between the first region of the first inner wall surface 4a1 and the second region of the first inner wall surface 4a1.

Each of the first claw 190f1 and the second claw 190f2 includes the protrusion 191 and the hook 192 similar to those of the first embodiment. The protrusion 191 protrudes from the first inner wall 4a1 in the −Y direction. The protrusion 191 has an upper surface (XY plane in the +Z direction) on which the inner terminals 19a are disposed. The protrusion 191 functions as a terminal block. The protrusion 191 has a lower surface (XY plane in the −Z direction). The hook 192 extends from the tip (in the −Y direction) of the lower surface of the protrusion 191 in the direction toward the baseplate 8 (−Z direction).

The protrusion 191 of the first claw 190f1, which extends in the −X direction to the second inner wall 4a2, is connected to the second inner wall 4a2. The protrusion 191 of the second claw 190f2, which extends in the +X direction to the third inner wall surface 4a3, is connected to the third inner wall surface 4a3. Thus, in this embodiment, a portion of the first claw 190f1 is supported on the second inner wall surface 4a2, whereas a portion of the second claw 190f2 is supported on the third inner wall surface 4a3.

The hook 192 of the first claw 190f1 faces the second inner wall surface 4a2 via a predetermined gap 261. The hook 192 of the second claw 190f2 faces the third inner wall surface 4a3 via a predetermined gap 262. Thus, in this embodiment, the gap 261, which is used to release a void, is between the hook 192 of the first claw 190f1 and the second inner wall surface 4a2, and the gap 262, which is used to release a void, is between the hook 192 of the second claw 190f2 and the third inner wall surface 4a3.

According to this embodiment, the portion of the first claw 190f1 is supported on the second inner wall surface 4a2, and the portion of the second claw 190f2 is supported on the third inner wall surface 4a3. Therefore, the mechanical strength of the terminal block can be increased, and the resonance of the terminal block can be suppressed when the wiring member W is joined to the inner terminal 19a, and a bond of the wiring member W can be increased. In addition, according to this embodiment, there are three gaps that are used to release a void. The first gap is the region 199 between the first claw 190f1 and the second claw 190f2. The second gap is the gap 261 between the hook 192 of the first claw 190f1 and the second inner wall surface 4a2. The third gap is the gap 262 between the hook 192 of the second claw 190f2 and the third inner wall surface 4a3. Accordingly, according to this embodiment, it is possible to prevent accumulation of voids below the first claw 190f1 and to prevent accumulation of voids below the second claw 190f2.

DESCRIPTION OF REFERENCE SIGNS

1 . . . semiconductor device, 2 . . . module, 3 . . . cooler, 4 . . . case, 5 . . . encapsulating material, 6 . . . insulating substrate, 7 . . . semiconductor element, 8 . . . baseplate, 10 . . . metal wiring plate, 4a . . . opening, 40, 41 . . . wall, 16 . . . P terminal, 17 . . . N terminal, 18 . . . M terminal, 19 . . . terminal, 20, 201, 201a, 201b . . . through hole, 42, 43, 44 . . . recess, 16a, 17a, 18a . . . nut, 16c, 17c, 18c . . . threaded hole, 16b, 17b, 18b . . . plate member, 19a, 19aa, 19aa1, 19aa2 . . . inner terminal, 19b . . . outer terminal, 41a . . . pillar, 190, 190a, 190b, 190c, 190c1, 190c2, 190c3, 190d, 190f1, 190f2 . . . claw, 191, 191c1, 191c2, 191c3 . . . protrusion, 192 . . . hook, 193, 194 . . . inner wall surface, 195, 196, 197 . . . inner surface, 199 . . . region, 60 . . . insulating plate, 61 . . . heat sink, 62 . . . circuit board, 261, 261 . . . gap, S1 . . . bonding material, S2 . . . adhesive, 190S . . . space, W . . . wiring member.

What is claimed is:

1. A semiconductor device comprising:
a baseplate;
an insulating substrate on the baseplate;
a semiconductor element on the insulating substrate;
a case bonded to the baseplate by an adhesive, the case surrounding a space in which the semiconductor element is positioned; and
an encapsulating material filling the space surrounded by the case,
wherein:
the case includes a claw, and
the claw includes:
a protrusion protruding from an inner wall surface of the case; and
a hook inclined from the protrusion so that a portion of the space filled with the encapsulating material is sandwiched between the hook and the inner wall surface of the case.

2. The semiconductor device according to claim 1, wherein:
the case includes a thermoplastic resin and a filler,
the encapsulating material includes a thermosetting resin and a filler, and
the adhesive includes an epoxy resin, a silicone resin, or an acrylic resin.

3. The semiconductor device according to claim 1, wherein the hook of the claw extends in a direction toward the baseplate.

4. The semiconductor device according to claim 1, wherein the hook of the claw extends in a direction opposite to a direction toward the baseplate.

5. The semiconductor device according to claim 1, wherein the claw includes:
a first hook extending in a direction toward the baseplate; and
a second hook extending in a direction opposite to the direction toward the baseplate.

6. The semiconductor device according to claim 1, wherein:
the inner wall surface of the case includes a first region and a second region,
the first region is closer to the baseplate than the protrusion,
the second region is farther from the baseplate than the protrusion, and
the first region is closer to an outer wall surface of the case than the second region.

7. The semiconductor device according to claim 1, wherein:
the hook includes an inner surface facing the inner wall surface of the case,
the protrusion includes an inner surface facing a space sandwiched between the inner surface of the hook and the inner wall surface of the case, and
the inner surface of the hook, the inner wall surface of the case, and the inner surface of the protrusion are rougher than another inner wall surface of the case.

8. The semiconductor device according to claim 1, wherein:
the protrusion of the claw is a terminal block including a terminal electrically connected to the semiconductor element via a wiring member, and
all terminal blocks are each the protrusion of the claw.

9. The semiconductor device according to claim 8, wherein the wiring member includes a wire, the wiring member being coupled to the terminal.

10. The semiconductor device according to claim 8, wherein the inner wall surface of the case includes:
   a region on which the claw including the terminal block is disposed; and
   a region on which no claw is disposed, the region on which no claw is disposed being at each of sides of the region on which the claw is disposed.

11. The semiconductor device according to claim 8, wherein:
   the claw is case includes a first claw and a second claw,
   the inner wall surface of the case includes:
      a first inner wall surface;
      a second inner wall surface; and
      a third inner wall surface, so that a space facing the first inner wall surface is sandwiched between the second inner wall surface and the third inner wall surface,
   the first claw and the second claw are disposed on the first inner wall surface,
   a portion of the first claw is supported on the second inner wall surface,
   a portion of the second claw is supported on the third inner wall surface, and
   the first inner wall surface includes:
      a first region on which the first claw is disposed;
      a second region on which the second claw is disposed; and
      a third region on which no claw is disposed, the third region being between the first region and the second region.

12. The semiconductor device according to claim 8, wherein:
   the terminal of the terminal block is a plurality of terminals, and
   the terminal block includes a through hole at a region between the plurality of terminals, the through hole communicating with the space.

13. The semiconductor device according to claim 12, wherein:
   the through hole has a first opening end and a second opening end,
   the first opening end is closer to the baseplate than the second opening end, and
   the through hole has a tapered shape in which an opening area of the second opening end is smaller than an opening area of the first opening end.

14. The semiconductor device according to claim 12, wherein:
   the claw includes an opposing surface facing the baseplate,
   the opposing surface has a tapered shape in which a first distance is greater than a second distance,
   the first distance is a distance from a position of an opening end of the through hole to the baseplate, and
   the second distance is a distance from a position of a first portion of the opposing surface to the baseplate, the first portion of the opposing surface being away from the opening end of the through hole.

15. The semiconductor device according to claim 8, wherein the terminal protrudes from a tip of the terminal block.

16. The semiconductor device according to claim 15, wherein a portion of the terminal protruding from the tip of the terminal block has a shape of a round plane.

17. The semiconductor device according to claim 15, wherein a portion of the terminal protruding from the tip of the terminal block has a shape of a plane having a corner with an obtuse angle.

18. The semiconductor device according to claim 1, wherein the hook is spaced apart from the insulating substrate and is covered with the encapsulating material.

* * * * *